(12) United States Patent
Wu et al.

(10) Patent No.: US 8,604,520 B2
(45) Date of Patent: Dec. 10, 2013

(54) VERTICAL TRANSISTOR AND ARRAY OF VERTICAL TRANSISTOR

(75) Inventors: Tieh-Chiang Wu, Yilan County (TW); Yu-Teh Chiang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 810 days.

(21) Appl. No.: 12/573,150

(22) Filed: Oct. 4, 2009

(65) Prior Publication Data

US 2011/0079823 A1    Apr. 7, 2011

(51) Int. Cl.
*H01L 29/72*    (2006.01)

(52) U.S. Cl.
USPC .... 257/204; 257/330; 257/347; 257/E29.262; 257/E27.06

(58) Field of Classification Search
USPC ............. 257/204, 330, 347, E29.262, E27.06
See application file for complete search history.

(56) References Cited

U.S. PATENT DOCUMENTS

| | | | |
|---|---|---|---|
| 6,255,171 B1 * | 7/2001 | Noble | 438/266 |
| 2008/0035987 A1 | 2/2008 | Hebert | |
| 2012/0028426 A1 * | 2/2012 | Hebert | 438/270 |

OTHER PUBLICATIONS

"Office Action of Taiwan Counterpart Application", issued on Jan. 9, 2013, p1-p6, in which the listed reference was cited.

* cited by examiner

*Primary Examiner* — Edward Wojciechowicz
(74) *Attorney, Agent, or Firm* — Jianq Chyun IP Office

(57) ABSTRACT

A vertical transistor includes a substrate, a gate, a source region, a drain region, a channel region and a gate dielectric layer. A trench is formed in the substrate, and the gate is disposed in the trench. The source region is disposed in the substrate beneath the gate. The drain region is disposed above the gate. The channel region is disposed at two sides of the gate and located between the source region and the drain region. The gate dielectric layer is located between the gate and the channel region.

16 Claims, 10 Drawing Sheets

VERTICAL TRANSISTOR AND ARRAY OF VERTICAL TRANSISTOR

BACKGROUND OF THE INVENTION

1. Field of the Invention

This invention relates to a transistor structure, and more particularly to a vertical transistor and an array of a vertical transistor.

2. Description of Related Art

In order to accelerate operating speed of integrated circuits and to meet customers' demands for miniaturizing electronic devices, physical dimensions of transistors in a semiconductor apparatus are continuously reduced. However, with the reduction in physical dimensions of transistors, the length of channel regions in the transistors is also reduced. Thus, a severe short channel effect would occur in the transistors, and its ON current is likely to decrease. A conventional solution to said issue is to enhance the dopant concentration in the channel region. Nevertheless, this method causes an increase in a leakage current and therefore affects the reliability of devices.

Hence, to resolve said issue, a conventional horizontal transistor structure is recently replaced by a vertical transistor structure in the industry. For example, the vertical transistor structure is formed in the deep trench of the substrate. Hence, the operating speed and integration of integrated circuits are enhanced and problems such as short channel effect are avoided. Currently, improvements in structural design and channel control of the existing vertical transistors are studied aggressively in this field.

SUMMARY OF THE INVENTION

The invention is directed to a vertical transistor having high driving current and superior device characteristics.

The invention is further directed to an array of a vertical transistor, in which the array has high driving current and superior device characteristics.

The invention is directed to a vertical transistor including a substrate, a gate, a source region, a drain region, a channel region and a gate dielectric layer. A trench is formed in the substrate and the gate is disposed in the trench. The source region is disposed in the substrate beneath the gate. The drain region is disposed above the gate. The channel region is disposed at two sides of the gate and located between the source region and the drain region. The gate dielectric layer is located between the gate and the channel region.

According to an embodiment of the invention, the gate dielectric layer is disposed on a sidewall of the trench.

According to an embodiment of the invention, the vertical transistor further includes a dielectric layer located between the gate and the source region.

According to an embodiment of the invention, the dielectric layer is disposed at the bottom of the trench.

According to an embodiment of the invention, the vertical transistor further includes a dielectric layer located between the gate and the drain region.

According to an embodiment of the invention, the dielectric layer is disposed at the top of the trench.

According to an embodiment of the invention, the drain region is located in the substrate above the gate.

According to an embodiment of the invention, a method of forming the drain region includes an implantation method or a diffusion method.

According to an embodiment of the invention, the drain region includes two doped blocks and a conductive block. The doped blocks are located in the substrate above two sides of the gate. The conductive block is located on the substrate and electrically connected to the doped blocks.

According to an embodiment of the invention, a method of forming the doped blocks includes an implantation method or a diffusion method.

According to an embodiment of the invention, the conductive block is made of polysilicon.

According to an embodiment of the invention, the source region and the drain region have the same conductive type.

According to an embodiment of the invention, the gate is made of metal.

The invention is further directed to an array of a vertical transistor. The array of the vertical transistor includes a substrate, a plurality of source regions, a plurality of gate lines, a plurality of isolation structures, a plurality of drain regions, a plurality of channel regions, and a plurality of gate dielectric layers. The source regions are disposed in the substrate in parallel along a first direction. The gate lines are disposed in the substrate in parallel along a second direction and above the source regions. The isolation structures are disposed between the source regions and between the gate lines. The drain regions are disposed above the gate lines. Each channel region is disposed at two sides of each gate line and located between a corresponding source region and a corresponding drain region. The gate dielectric layers are located between the gate lines and the channel regions.

According to an embodiment of the invention, the first direction is perpendicular to the second direction.

According to an embodiment of the invention, each drain region includes two doped blocks and a conductive block. The doped blocks are located in the substrate above two sides of a corresponding gate line. The conductive block is located on the substrate and electrically connected to the doped blocks.

According to an embodiment of the invention, the source regions and the drain regions have the same conductive type.

According to an embodiment of the invention, the gate lines are made of metal.

In light of the foregoing, in the vertical transistor and the array of the vertical transistor of the invention, the channel region is formed at the two sides of the gate, such that the transistor has high driving current and superior device characteristics.

In order to make the aforementioned and other features of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3-1, 4-1, 5-1, 6-1 and 7-1 are top views illustrating a process of fabricating the array of the vertical transistor shown in FIG. 2. FIGS. 3-2, 4-2, 5-2, 6-2, and 7-2 respectively illustrate cross-sectional views taken along a line A-A' of FIGS. 3-1, 4-1, 5-1, 6-1 and 7-1. FIGS. 3-3, 4-3, 5-3, 6-3 and 7-3 respectively illustrate cross-sectional views taken along a line B-B' of FIGS. 3-1, 4-1, 5-1, 6-1 and 7-1. FIGS. 5-4, 6-4 and 7-4 respectively illustrate cross-sectional views taken along line C-C' of FIGS. 5-1, 6-1 and 7-1.

DESCRIPTION OF EMBODIMENTS

Figure 1:
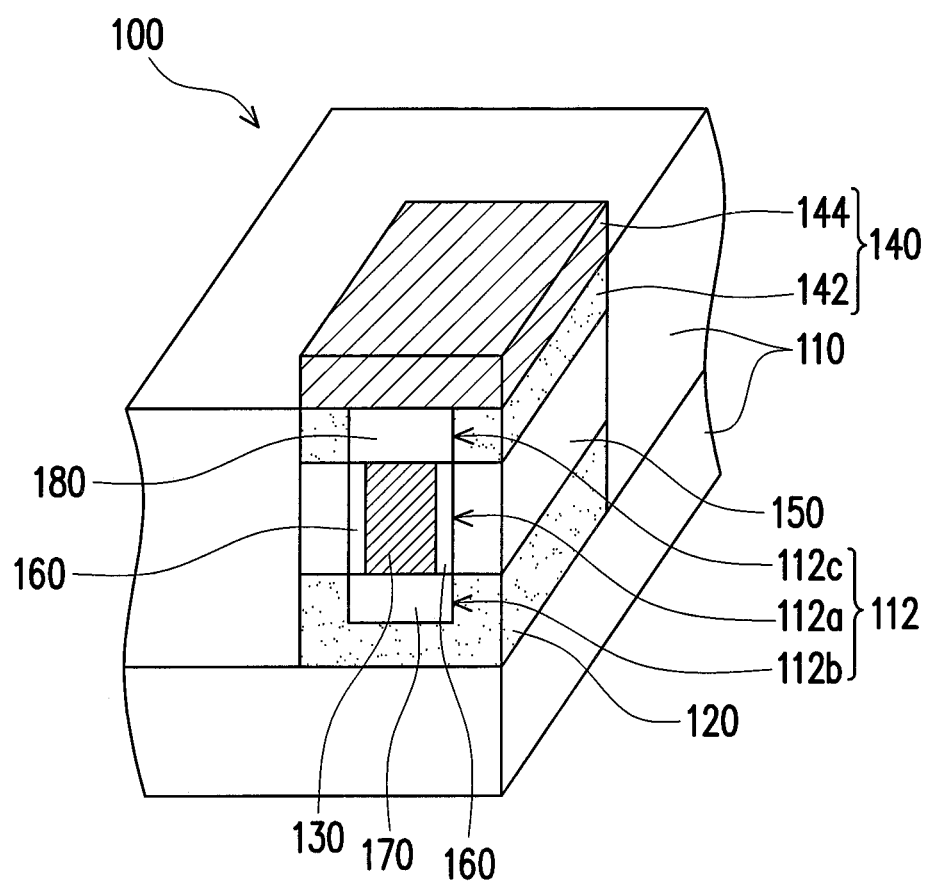
FIG. 1 is a schematic three-dimensional view of a vertical transistor according to a first embodiment of the invention.

FIG. 1 is a schematic three-dimensional view of a vertical transistor according to a first embodiment of the invention.

Referring to FIG. 1, a vertical transistor 100 includes a substrate 110, a gate 130, a source region 120, a drain region 140, a channel region 150, and a gate dielectric layer 160. In the present embodiment, the vertical transistor 100 further includes dielectric layers 170, 180.

A trench 112 is formed in the substrate 110 and the gate 130 is disposed in the trench 112. In the present embodiment, the gate dielectric layer 160 is disposed on sidewalls 112a of the trench 112, for example. The dielectric layer 170, for instance, is disposed at a bottom 112b of the trench 112. The dielectric layer 180, for example, is disposed at a top 112c of the trench 112. In other words, the gate dielectric layer 160 and the dielectric layers 170, 180 surround the gate 130 so as to be disposed in the trench 112. In the present embodiment, the substrate 110 is, for example, a silicon substrate. The gate 130 is, for example, made of metal, and formed by a chemical vapor deposition (CVD) or a physical vapor deposition (PVD), for example. The gate dielectric layer 160 is, for example, made of silicon oxide, silicon nitride, or other suitable dielectric materials. The gate dielectric layer 160 is formed by, for example, a thermal oxidation process. The dielectric layers 170, 180 are, for example, made of silicon oxide, silicon nitride, or other suitable dielectric materials. The dielectric layers 170, 180 are formed by, for example, a CVD.

The source region 120 is disposed in the substrate 110 beneath the gate 130. The drain region 140 is disposed above the gate 130. The dielectric layer 170 is located between the source region 120 and the gate 130, so that the source region 120 is insulated from the gate 130. The dielectric layer 180 is located between the drain region 140 and the gate 130, so that the drain region 140 is insulated from the gate 130. In the present embodiment, the drain region 140 includes two doped blocks 142 located in the substrate 110 and a conductive block 144 located on the substrate 110. The doped blocks 142, for example, are located in the substrate 110 above two sides of the gate 130. That is, the doped blocks 142 are located at two sides of the top 112c of the trench 112 so as to be separated by the dielectric layer 180. The conductive block 144 is located on the substrate 110 and electrically connected to the doped blocks 142, for instance. The source region 120 and the drain region 140 have the same conductive type. In the present embodiment, the source region 120 and the doped regions 142 are n-type silicon layers, for example. The conductive block 144 is made of polysilicon, for instance. The source region 120 is formed by an ion implantation, for example. The doped regions 142 are formed by an ion implantation method or a diffusion method, for instance. The conductive block 144, for example, is formed by a CVD. It should be noted that in other embodiments, the drain region 140 has other structures and is not limited to the structures aforementioned. Furthermore, in the present embodiment, conductivity types of the source region 120 and the drain region 140 are n-type. However, in another embodiment, conductivity types of the source region 120 and the drain region 140 are p-type.

The channel region 150 is disposed at two sides of the gate 130 and located between the source region 120 and the drain region 140. The gate dielectric layer 160 is located between the gate 130 and the channel region 150. In one embodiment, the channel region 150 can also be a doped region with a doping concentration lower than those of the source region 120 and the drain region 140.

In the vertical transistor 100, the channel region 150 is formed at the two sides of the gate 130. Thus, the total length of the channel region 150 is the sum of the lengths of the two sides of the gate 130. As a consequence, the vertical transistor 100 has high driving current and superior device characteristics. Moreover, compared to a horizontal transistor structure, in the vertical transistor 100, the width of the gate 130 in the substrate 110 can be reduced to enhance device integration. Further, the length of the channel region 150 of the vertical transistor 100 can be accurately controlled by controlling the depth of the trench 112, so that problems such as short channel effect occurred when reducing device dimensions are prevented.

Figure 2:
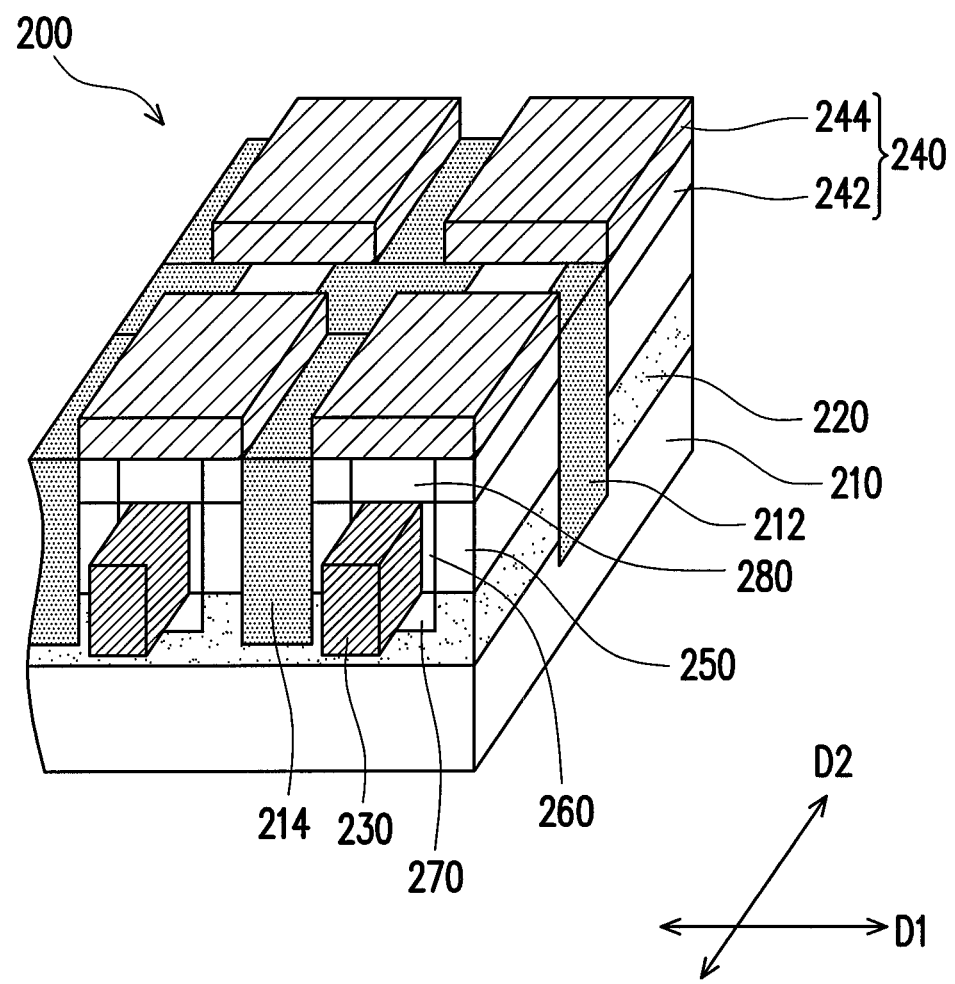
FIG. 2 is a schematic three-dimensional view of an array of a vertical transistor according to a second embodiment of the invention.

FIG. 2 is a schematic three-dimensional view of an array of a vertical transistor according to a second embodiment of the invention.

Referring to FIG. 2, a vertical transistor array 200 includes a substrate 210, a plurality of source regions 220, a plurality of gate lines 230, a plurality of isolation structures 212, 214, a plurality of drain regions 240, a plurality of channel regions 250, and a plurality of gate dielectric layers 260. In the present embodiment, the vertical transistor array 200 further includes dielectric layers 270, 280.

The source regions 220 are disposed in the substrate 210 in parallel along a first direction D1. The isolation structures 212 are disposed between the source regions 220. The gate lines 230 are disposed in the substrate 210 in parallel along a second direction D2. The isolation structures 214 are disposed between the gate lines 230. In the present embodiment, the first direction D1 and the second direction are perpendicular to each other, for example. The substrate 210 is, for example, a silicon substrate. The source regions 220 are n-type silicon layers, for example, and formed by an ion implantation method, for example. The gate lines 230 are, for example, made of metal, and formed by, for example, a CVD. The isolation structures 212, 214 are shallow trench isolation (STI) structures, for example. The isolation structures 212, 214 are made of silicon oxide, for example. In addition, in the present embodiment, the dielectric layers 270 are disposed between the source regions 220 and the gate lines 230, so that the source regions 220 are insulated from the gate lines 230. The dielectric layers 270 are made of, for example, silicon oxide, silicon nitride, or other suitable dielectric materials.

The drain regions 240 are disposed above the gate lines 230. In the present embodiment, each drain region 240 includes two doped blocks 242 and a conductive block 244. The doped blocks 242 are located in the substrate 210 above two sides of a corresponding gate line 230 and separated by the dielectric layer 280. The conductive block 244 is located on the substrate 210 and electrically connected to the doped blocks 242. The source regions 220 and the drain regions 240 have the same conductive type. Therefore, in the present embodiment, the doped blocks 242 are n-type silicon layers, for example, and formed by an ion implantation method or a diffusion method, for example. The conductive block 244 is made of, for example, polysilicon, and formed by a CVD, for example. The dielectric layers 280 are disposed between the drain regions 240 and the gate lines 230, so that the drain regions 240 are insulated from the gate lines 230. The dielectric layers 280 are made of, for example, silicon oxide, silicon nitride, or other suitable dielectric materials. It should be noted that in other embodiments, the drain regions 240 have other structures and are not limited to the structures aforementioned. Furthermore, in the present embodiment, conductivity types of the source regions 220 and the drain regions 240 are n-type. However, in another embodiment, conductivity types of the source regions 220 and the drain regions 240 are p-type.

Each channel region 250 is disposed at two sides of the gate lines 230 and located between a corresponding source region 220 and a corresponding drain region 240. The gate dielectric layers 260 are located between the gate lines 230 and the channel regions 250. In one embodiment, each channel region 250 can also be a doped region with a doping concentration lower than those of the source regions 220 and the drain regions 240. The gate dielectric layers 260 are, for example, made of silicon oxide, silicon nitride, or other suitable dielectric materials. The gate dielectric layers 260 are formed by, for example, a thermal oxidation process.

In the vertical transistor array 200, each channel region 250 is formed on the two sides of each gate line 230, such that the vertical transistor array 200 has high driving current and superior device characteristics.

Next, a method of fabricating the vertical transistor array 200 of the second embodiment is illustrated in the following. However, the fabricating method and process described herein are merely exemplary and the invention is not limited thereto. Furthermore, the vertical transistor 100 of the first embodiment of the invention as shown in FIG. 1 can also be fabricated using the following exemplary process. Obviously, the vertical transistor 100 can also be fabricated using other methods and the invention is not limited thereto.

FIGS. 3-1, 4-1, 5-1, 6-1 and 7-1 are top views illustrating a process of fabricating the vertical transistor array shown in FIG. 2. FIGS. 3-2, 4-2, 5-2, 6-2, and 7-2 respectively illustrate cross-sectional views taken along a line A-A' of FIGS. 3-1, 4-1, 5-1, 6-1 and 7-1. FIGS. 3-3, 4-3, 5-3, 6-3 and 7-3 respectively illustrate cross-sectional views taken along a line B-B' of FIGS. 3-1, 4-1, 5-1, 6-1 and 7-1. FIGS. 5-4, 6-4 and 7-4 respectively illustrate cross-sectional views taken along line C-C' of FIGS. 5-1, 6-1 and 7-1.

Figures 1, 3:
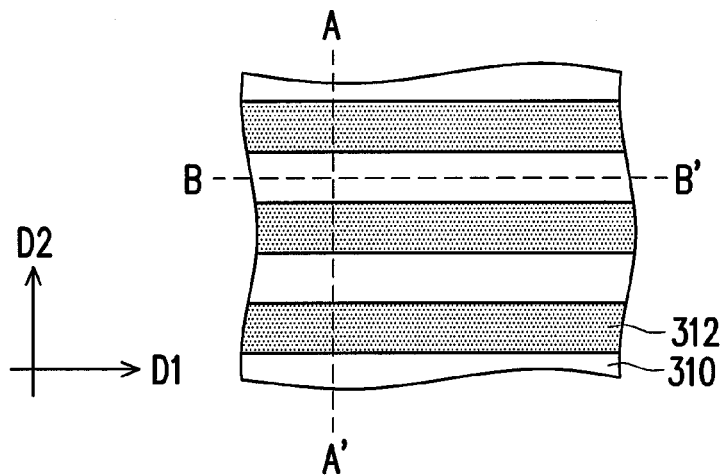
Figures 2, 3:
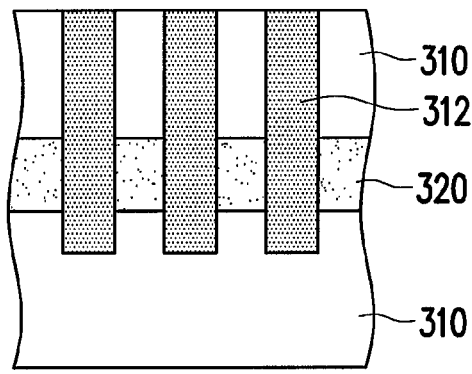
Figure 3:
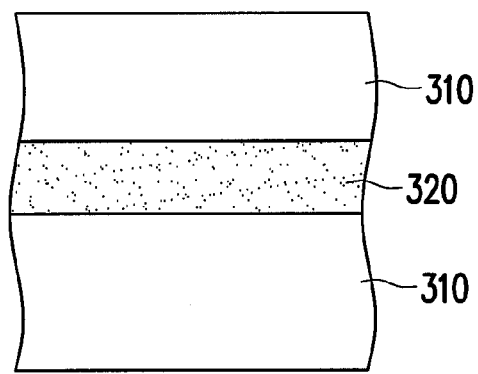
Figures 1, 4:
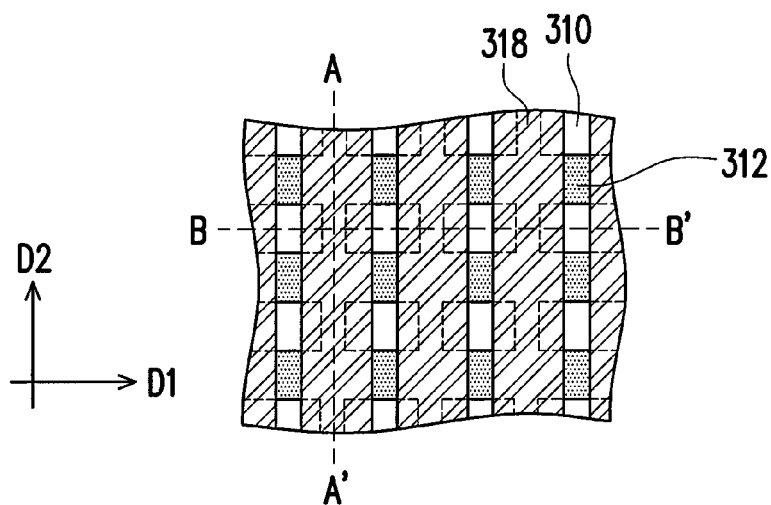
Figures 2, 4:
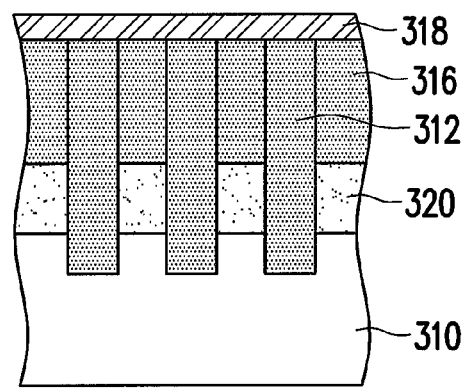
Figures 3, 4:
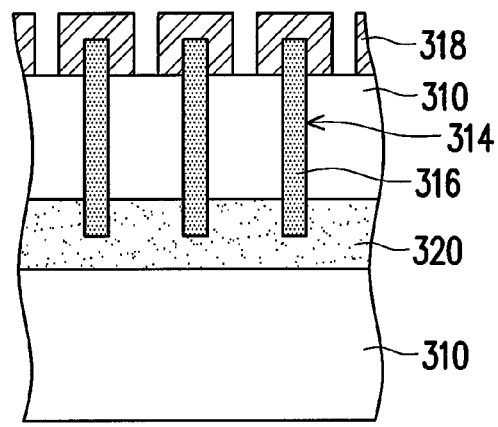
Figures 1, 5:
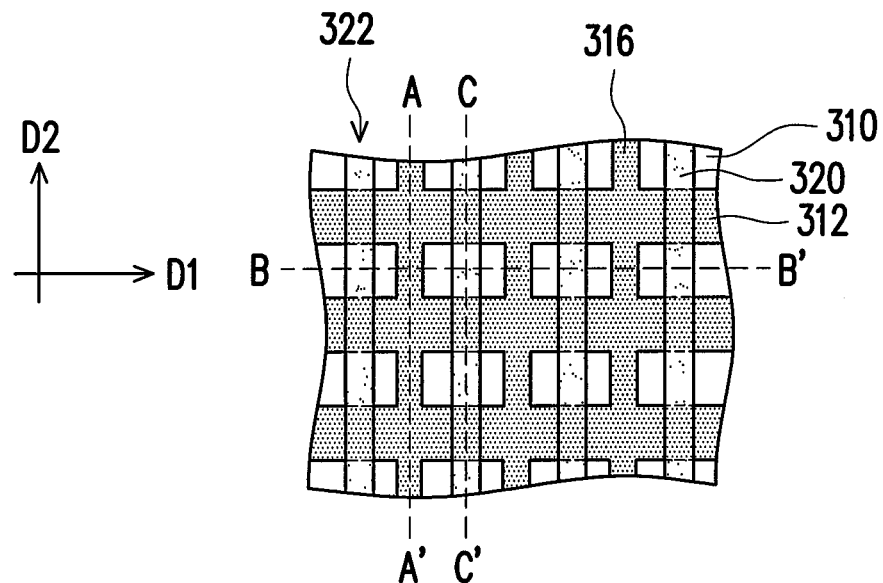
Figures 2, 5:
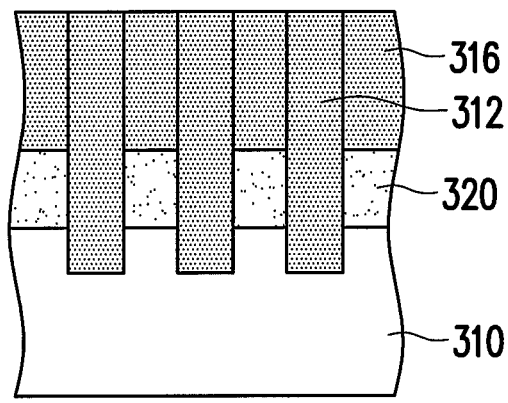
Figures 3, 5:
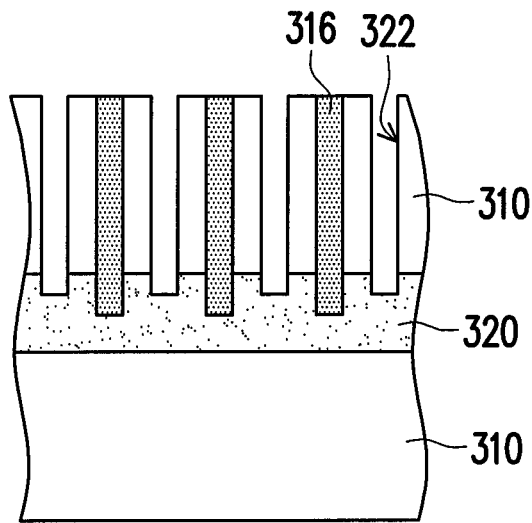
Figures 4, 5:
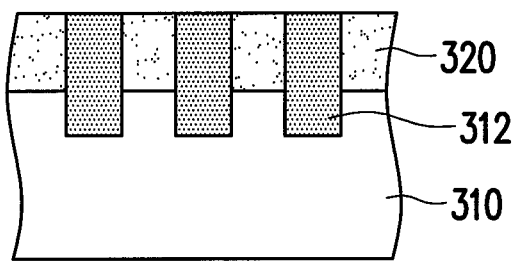

Referring to FIGS. 3-1, 3-2, and 3-3, firstly, a plurality of isolation structures 312 extending along a first direction D1 is formed in a substrate 310. A plurality of source regions 320 extending along the first direction D1 is formed in the substrate 310 between the isolation structures 312. In the present embodiment, the substrate 310 is, for example, a silicon substrate. The source regions 320 are formed by implanting an n-type dopant at a predetermined depth of the substrate 310, for instance. Thus, the source regions 320 are n-type silicon layers, for example. The isolation structures 312 are shallow trench isolation (STI) structures, for example. The isolation structures 312 are made of silicon nitride, silicon oxide, or other suitable insulating materials, for example.

Referring to FIGS. 4-1, 4-2, and 4-3, the substrate 310 is patterned so as to form a plurality of trenches 314 in the substrate 310, and isolation structures 316 are formed in the trenches 314. The isolation structures 316 protrude from a surface of the substrate 310. Thereafter, a patterned mask layer 318 is formed on the substrate 310 and exposes a portion of the substrate 310. In the present embodiment, the isolation structure 316 is made of silicon nitride, silicon oxide, or other suitable insulating materials, for example. The patterned mask layer 318 is made of silicon oxide, for example.

Referring to FIGS. 5-1, 5-2, 5-3, and 5-4, the patterned mask layer 318 is used as a mask to remove a portion of the substrate 310 so as to form a plurality of trenches 322 in the substrate 310. Herein, the trenches 322 extend along a second direction D2, where the second direction D2 is perpendicular to the first direction D1, for example.

Afterwards, the patterned mask layer 318 and the protrusion of the isolation structure 316 are removed to flatten the surface of the substrate 310. In the present embodiment, the patterned mask layer 318 and the protrusion of the isolation structure 316 are partially removed by using a dry-etching method or other suitable methods, for example. Thereafter, the remained patterned mask layer 318 and the protrusion of the isolation structure 316 are removed by, for example, using a chemical mechanical polishing process or other suitable methods flatten the surface of the substrate 310

Figures 1, 6:
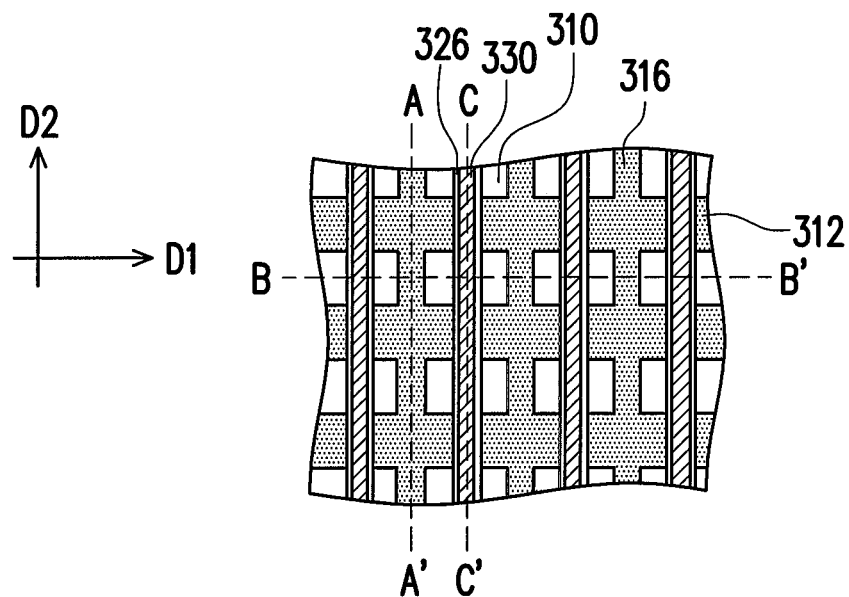
Figures 2, 6:
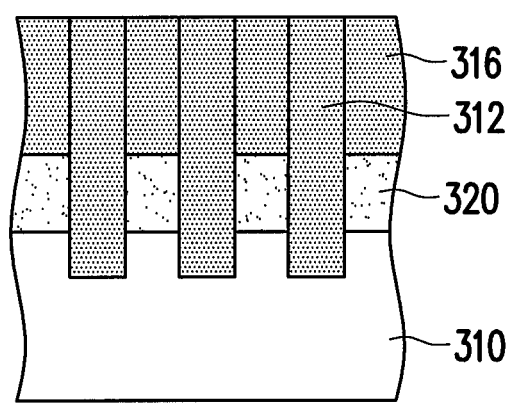
Figures 3, 6:
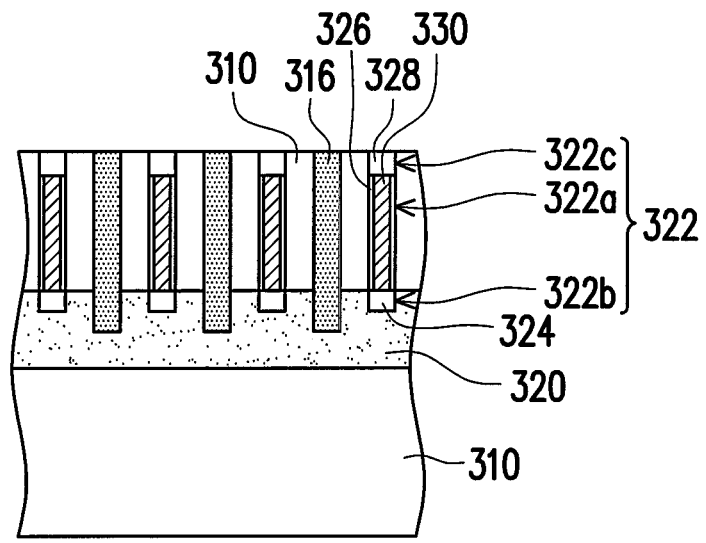
Figures 4, 6:
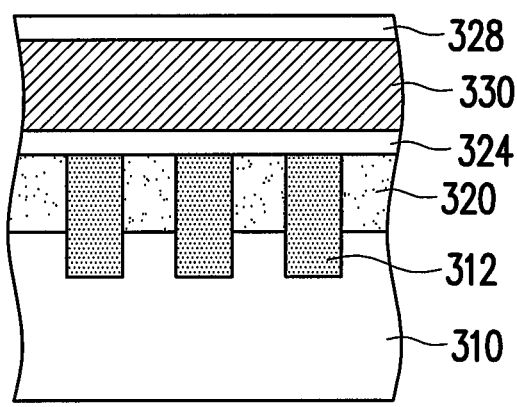
Figures 1, 7:
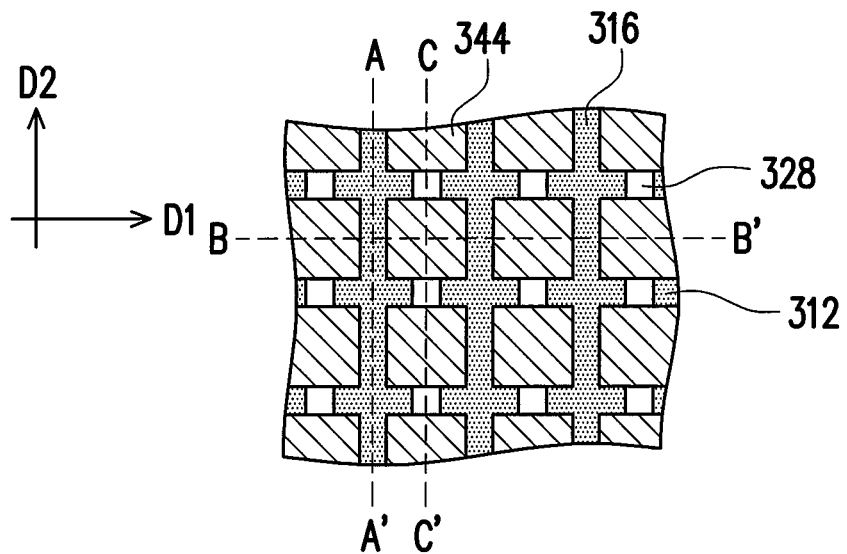
Figures 2, 7:
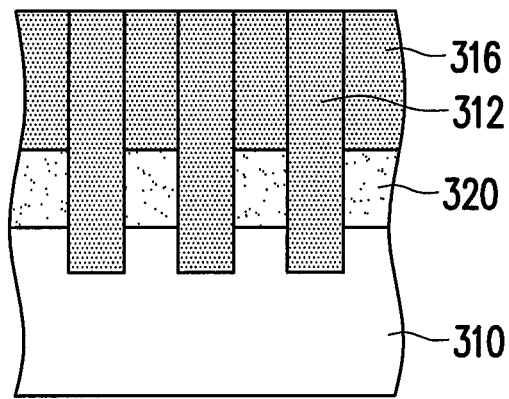
Figures 3, 7:
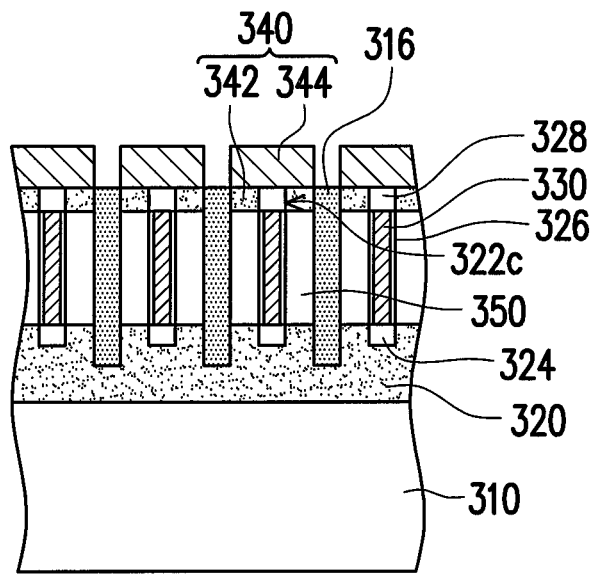
Figures 4, 7:
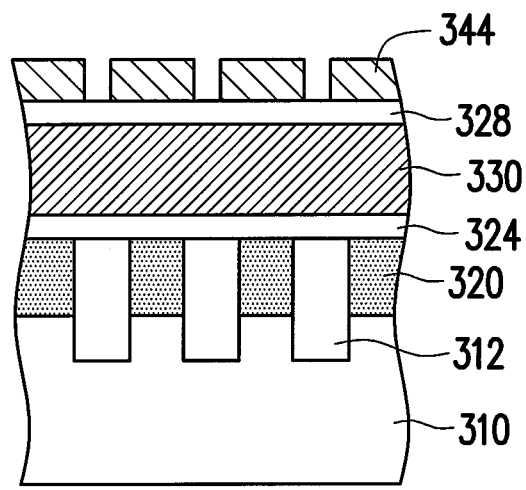

Referring to FIGS. 6-1, 6-2, 6-3, and 6-4, dielectric layers 328 are omitted in FIG. 6-1. Each dielectric layer 324 is formed at a bottom 322b of the trench 322 and each gate dielectric layer 326 is formed on sidewalls 322a of the trench 322. Later, each gate line 330 is formed in the trench 322. As shown in FIGS. 6-1 and 6-3, the gate lines 330 are disposed in the substrate 310 in parallel along the second direction D2 and are disposed above the source regions 320. Next, each dielectric layer 328 is formed on a top 322c of the trench 322 to cover the gate lines 330. In the present embodiment, the dielectric layers 324, 328 and the gate dielectric layers 326 are made of silicon oxide, for example. The dielectric layers 324, 328 are formed by a CVD, for instance. The gate dielectric layers 326 are formed by a thermal oxidation process, for example. The gate lines 330 are, for example, made of metal, and formed by, for example, a CVD.

Referring to FIGS. 7-1, 7-2, 7-3, and 7-4, drain regions 340 are then formed in the substrate 310. In the present embodiment, a method of forming the drain regions 340 is illustrated below. Doped blocks 342 are first formed in the substrate 310 at respective sides of the top 322c of the trench 322, for example. A conductive block 344 is then formed on the doped blocks 342. The conductive block 344 is electrically connected to the doped blocks 342. The doped blocks 342 and the source regions 320 have the same conductive type, and are formed by implanting an n-type dopant into the substrate 310, for instance. Thus, the doped blocks 342 are n-type silicon layers, for example. The conductive block 344 is made of, for example, polysilicon, and formed by a CVD, for example. In one embodiment, the doped blocks 342 may be formed by a diffusion method. Furthermore, in the present embodiment, conductivity types of the source regions 320 and the drain regions 340 are n-type. However, in another embodiment, conductivity types of the source regions 320 and the drain regions 340 are p-type.

After the formation of the drain regions 340, a channel region 350 is formed at two sides of each gate line 330 and located between a corresponding source region 320 and a corresponding drain region 340. The gate dielectric layers 326 are disposed between the channel regions 350 and the gate lines 330.

In a vertical transistor array 300 of the present embodiment, the channel region 350 is formed at two sides of each gate line 330, such that the vertical transistor array 300 has high driving current and superior device characteristics. In the present embodiment, the trenches 322 configured to form the gate lines 330 are formed by self-alignment. Therefore, the width of the gate lines 330 can be controlled accurately, so that the channel region 350 at two sides of each gate line 330 has a desired width, thereby enhancing device characteristics of the transistor.

In summary, in the vertical transistor and the array of the vertical transistor of the invention, the channel region is formed at two sides of the gate, such that the transistor has high driving current and superior device characteristics. In other words, the length of the channel region of the vertical transistor can be accurately controlled by controlling the depth of the trench configured to form the gate, so that problems such as short channel effect occurred when reducing device dimensions are prevented. Furthermore, the trench configured to form the gate is formed by self-alignment, such that the width of the gate can be controlled accurately, so that the channel region at two sides of the gate has a desired width. Hence, the device characteristics of the transistor are enhanced and the integration of the device is further increased.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A vertical transistor, comprising:
   a substrate, having a trench;
   a gate, disposed in the trench;
   a source region, disposed in the substrate beneath the gate;
   a drain region, disposed above the gate;
   a channel region, including a first portion and a second portion which are physically separated from each other, wherein the first portion and the second portion are disposed at opposite sides of the gate and located between the source region and the drain region, and the gate controls both of the first portion and the second portion which are physically separated from each other; and
   a gate dielectric layer, located between the gate and the channel region.

2. The vertical transistor as claimed in claim 1, wherein the gate dielectric layer is disposed on a sidewall of the trench.

3. The vertical transistor as claimed in claim 1, further comprising a dielectric layer located between the gate and the source region.

4. The vertical transistor as claimed in claim 3, wherein the dielectric layer is disposed at a bottom of the trench.

5. The vertical transistor as claimed in claim 1, further comprising a dielectric layer located between the gate and the drain region.

6. The vertical transistor as claimed in claim 5, wherein the dielectric layer is disposed at a top of the trench.

7. The vertical transistor as claimed in claim 1, wherein the drain region is located in the substrate above the gate.

8. The vertical transistor as claimed in claim 1, wherein the drain region comprises two doped blocks and a conductive block, the doped blocks are located in the substrate above two sides of the gate, and the conductive block is located on the substrate and electrically connected to the doped blocks.

9. The vertical transistor as claimed in claim 8, wherein a material of the conductive block comprises polysilicon.

10. The vertical transistor as claimed in claim 1, wherein the source region and the drain region have the same conductive type.

11. The vertical transistor as claimed in claim 1, wherein a material of the gate comprises metal.

12. An array of a vertical transistor, comprising:
    a substrate;
    a plurality of source regions, disposed in the substrate in parallel along a first direction;
    a plurality of gate lines, disposed in the substrate in parallel along a second direction and above the source regions;
    a plurality of isolation structures, disposed between the source regions and between the gate lines;
    a plurality of drain regions, disposed above the gate lines;
    a plurality of channel regions, wherein each channel region includes a first portion and a second portion which are physically separated from each other, the first portion and the second portion are disposed at opposite sides of each gate line and located between a corresponding source region and a corresponding drain region, and the gate line controls both of the first portion and the second portion which are physically separated from each other; and
    a plurality of gate dielectric layers, located between the gate lines and the channel regions.

13. The array of the vertical transistor as claimed in claim 12, wherein the first direction is perpendicular to the second direction.

14. The array of the vertical transistor as claimed in claim 12, wherein each drain region comprises two doped blocks and a conductive block, the doped blocks are located in the substrate above two sides of a corresponding gate line, and the conductive block is located on the substrate and electrically connected to the doped blocks.

15. The array of the vertical transistor as claimed in claim 12, wherein the source regions and the drain regions have the same conductive type.

16. The array of the vertical transistor as claimed in claim 12, wherein a material of the gate lines comprises metal.

* * * * *